(12) United States Patent
Tao et al.

(10) Patent No.: US 6,316,828 B1
(45) Date of Patent: Nov. 13, 2001

(54) STRUCTURE OF A SOLDER MASK FOR THE CIRCUIT MODULE OF A BGA SUBSTRATE

(75) Inventors: Su Tao; Tao-Yu Chen, both of Kaohsiung; Kao-Yu Hsu, Hsien, all of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/436,657

(22) Filed: Nov. 9, 1999

(51) Int. Cl.[7] .................................................. H01L 23/34
(52) U.S. Cl. ............................................. 257/723; 257/724
(58) Field of Search .................................. 257/723, 724, 257/725, 685, 697, 924

(56) References Cited

U.S. PATENT DOCUMENTS

| | | | |
|---|---|---|---|
| 5,640,048 | * 6/1997 | Harada | 257/659 |
| 5,825,628 | 10/1998 | Garbelli et al. | |
| 5,906,700 | 5/1999 | Furukawa. | |
| 6,091,144 | * 7/2000 | Harada | 257/724 |

* cited by examiner

*Primary Examiner*—Roy Potter
(74) *Attorney, Agent, or Firm*—Bacon & Thomas

(57) ABSTRACT

The structure of a solder mask for the circuit module of a BGA substrate mainly comprises a power ring, a ground ring, a plurality of holes, a plurality of first holes and a plurality of second holes. The power ring and the ground ring are arranged between the chip area and the wire bonding area; the first openings are arranged on the power ring and the ground ring for receiving the electronic part. Thus the substrate meets the requirement of keeping the electronic part close to the chip. The second openings are arranged over the associated holes which electrically connect to the power ring and the ground ring by traces; these holes do need not to electrically connect the power layer and the ground layer of the substrate. The openings of the present invention use the power ring, ground ring and the holes of the substrate to electrically connect to the electronic parts, so that the present invention does not need to provide other holes or traces thus simplifying the structure of the substrate. The distance of two openings of the present invention can, moreover, be adjusted according to the length of the electronic part.

18 Claims, 3 Drawing Sheets

STRUCTURE OF A SOLDER MASK FOR THE CIRCUIT MODULE OF A BGA SUBSTRATE

BACKGROUND OF THE INVENTION

1. Field of the Invention

The present invention is related to the structure of a solder mask for the circuit module of BGA substrate and more particularly to the openings in the structure of the solder mask for the electronic devices between the power ring and ground ring or between two through-holes.

2. Description of the Related Art

An integrated circuit needs power to operate and it has a plurality of wires connecting the power to the I/O ports of the integrated circuit. The wires themselves are the source of electromagnetic interference, especially when the integrated circuit transmits at high frequency. The wires of the integrated circuit emit electromagnetic interference which influences the normal operation of the integrated circuit. A capacitor is electrically connected to the wires and can reduce the electromagnetic interference of the wires.

U.S. Pat. No. 5,906,700, issued on May 25, 1999 to Furukawa et al., discloses a method of manufacturing a circuit module, as shown in FIG. 1. A substrate 100 has a chip 101 and a plurality of electronic parts 102, and an encapsulant 103 encapsulates the chip 101 and a portion of the electronic parts 102. However, the dimensions of the surface of the substrate 100 are limited around the periphery of the chip 101, and the electronic parts 102 must therefore be placed in an area farther away from the chip 101 on the substrate 100 due to the arrangement of the traces electrically connecting to the wires. Therefore, U.S. Pat. No. 5,906,700 fails to meet the requirement that the electronic parts 102 be arranged close to the chip 101 and necessitates rearrangement or addition of more traces, which complicates the process.

U.S. Pat. No. 5,825,628, issued on Oct. 20, 1998 to Garbelli et al., discloses an electronic package, as shown in FIG. 2. A substrate 200 is a multi-layer PCB and includes a power layer 201 connecting to a hole 202 and a ground layer 203 connecting to a hole 204. A chip 210 is adhesively attached to the substrate 200 and is enclosed by an encapsulant 211. An electronic part connects the hole 202 to the hole 204 for reduction of electromagnetic interference. The electronic part has a defined longitudinal distance but U.S. Pat. No. 5,825,628 must leave an area on its surface for the arrangement of a hole 202 to connect to the power layer 201 and the hole 204 to the ground layer 203. Because U.S. Pat. No. 5,825,628 must save a particular area for this electronic part, and further necessitates the manufacture of a new hole 202 to connect to the power layer 201 and a new hole 204 to connect to the ground layer 203 in this area. Thus the substrate 200 of U.S. Pat. No. 5,825,628 increases the complexity of the hole and the manufacture of traces. It also increases the limitation of the dimensions of substrate so that U.S. Pat. No. 5,825,628 fails to meet the requirement that the electronic part be close to the chip. The method of providing holes in substrate 200 is adapted to a multi-layer PCB, and the method of proving a hole to connect to the power layer or the ground layer cannot be applied to the dual-layer PCB without leaving space for the arrangement of the power layer or the ground layer.

The present invention intends to provide the structure of a solder mask for the circuit module of a BGA substrate with openings provided on the power ring, the ground ring and the original holes in such a way as to mitigate and overcome the above problem. Therefore, the openings are provided for the arrangement of the electronic part on the original holes and traces to reduce the density of the traces of the substrate.

SUMMARY OF THE INVENTION

The primary objective of this invention is to provide the structure of a solder mask for the circuit module of a BGA substrate in such a way that has the openings on the power ring, the ground ring and the original holes do not necessitate leaving space for the arrangement of the holes and the traces for electronic parts and thus brings the electronic part closer to the chip and simplifies the structure of the substrate.

The present invention is the structure of a solder mask for the circuit module of a BGA substrate. The substrate mainly comprises a power ring, a ground ring, a plurality of holes, a plurality of first holes and a plurality of second holes. The power ring and the ground ring are arranged between the chip area and the wire bonding area. The first openings are arranged on the power ring and the ground ring for receiving the electronic part. Thus the substrate meets the requirement of keeping the electronic part close to the chip. The second openings are arranged over the associated holes to electrically connect to the power ring and the ground ring via traces. These holes do not need to electrically connect the power layer and the ground layer of the substrate. The openings of the present invention use the power ring, ground ring and the holes of the substrate to electrically connect to the electronic parts, so the present invention does not necessitate the provision of other holes or traces and simplifies the structure of the substrate. The distance between the two openings of the present invention can, moreover, be adjusted according to the length of the electronic part.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

The structure of the solder mask for the circuit module of a BGA substrate, in accordance with the present invention, mainly comprises a plurality of predetermined openings which are arranged on the power ring and the ground ring. Because the distance between the power ring and the ground ring is too small, the openings are arranged in a diagonal direction for attachment to the two ends of the electronic part. The openings are arranged over the holes in the substrate, and the distance from one opening to the next opening satisfied the length requirement of the electronic part. These openings are electrically connected to the power ring and the ground ring by the traces.

Figure 3:
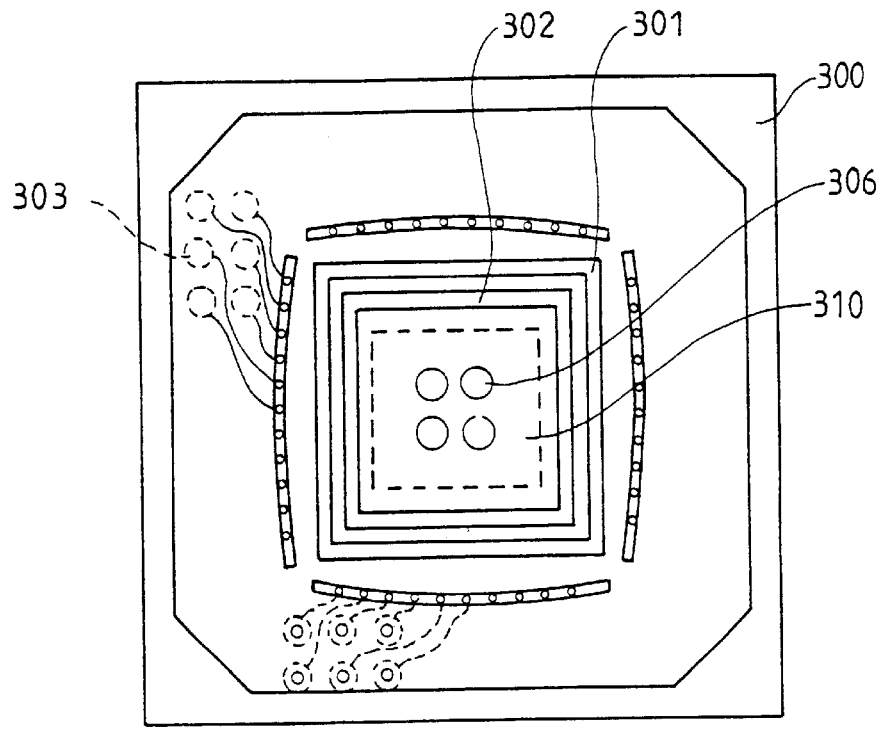
FIG. 3 is a top view of the substrate without the solder mask covering in accordance with the present invention.

Referring to FIG. 3, the substrate of the present invention can apply to a dual-layer PCB or a multi-layer PCB. A substrate 300 without a solder mask cover mainly comprises a power ring 301, a ground ring 302 and a plurality of holes 303. The power ring 301 and the ground ring 302 very closely surround the chip area 310. If the electronic part is arranged on the power ring 301 and the ground ring 302, the present invention meets the requirement of keeping the electronic part close to chip. One end of the hole 303 is provided for receiving the electronic part, and the other end is provided for connection to the solder ball. Pairs of holes 303 are electrically connected to the power ring 301 and the ground ring 302, which are connected to the power layer and the ground layer of the substrate 300. The chip area 310 further comprises a plurality of holes 306 for heat dissipation.

Figure 4:
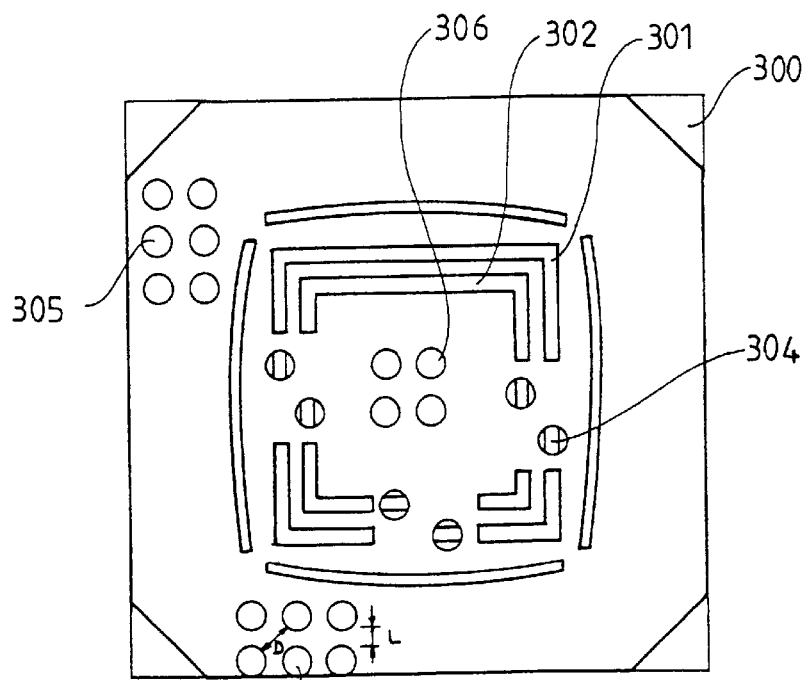
FIG. 4 is a top view of the substrate with the solder mask covering in accordance with the present invention.

Referring to FIG. 4, when the solder mask covers the substrate 300, the substrate 300 comprises a plurality of first openings 304 and a plurality of second openings 305. The first openings 304 are arranged on the power ring 301 and the ground ring 302. Because the distance between the power ring 301 and the ground ring 302 is too small, the openings 304 are arranged diagonally for attachment to the two ends of the electronic part. The second openings 305 are arranged over the holes 303; the distance L of every two openings 305 is approximately 1.27 mm, and the opening 305 is too close to the next opening 305. The distance D of two diagonal openings 305 is approximately 1.80 mm and is equal to the length of the electronic part, thus the electronic part can be arranged on the set of the second openings 305 in a diagonal line. A pad is printed in the first opening 304 and the second opening 305 for attachment to the electronic part.

Figure 5:
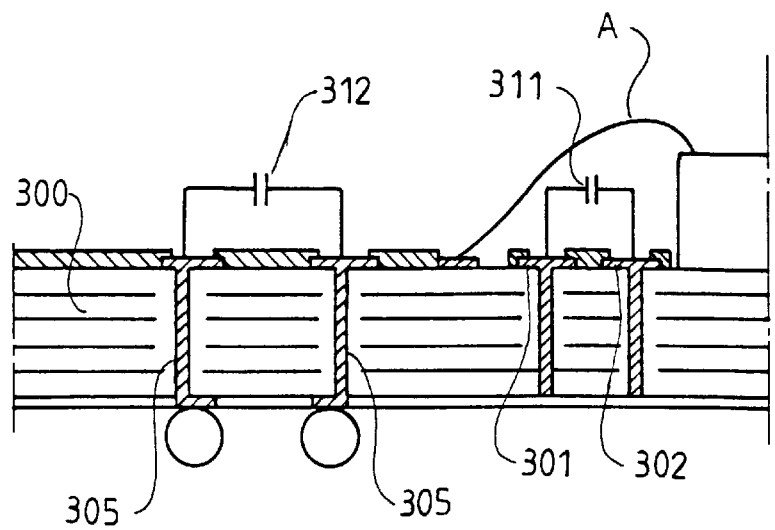
FIG. 5 is a side view of the circuit module of the substrate in accordance with the present invention.
Figure 6:
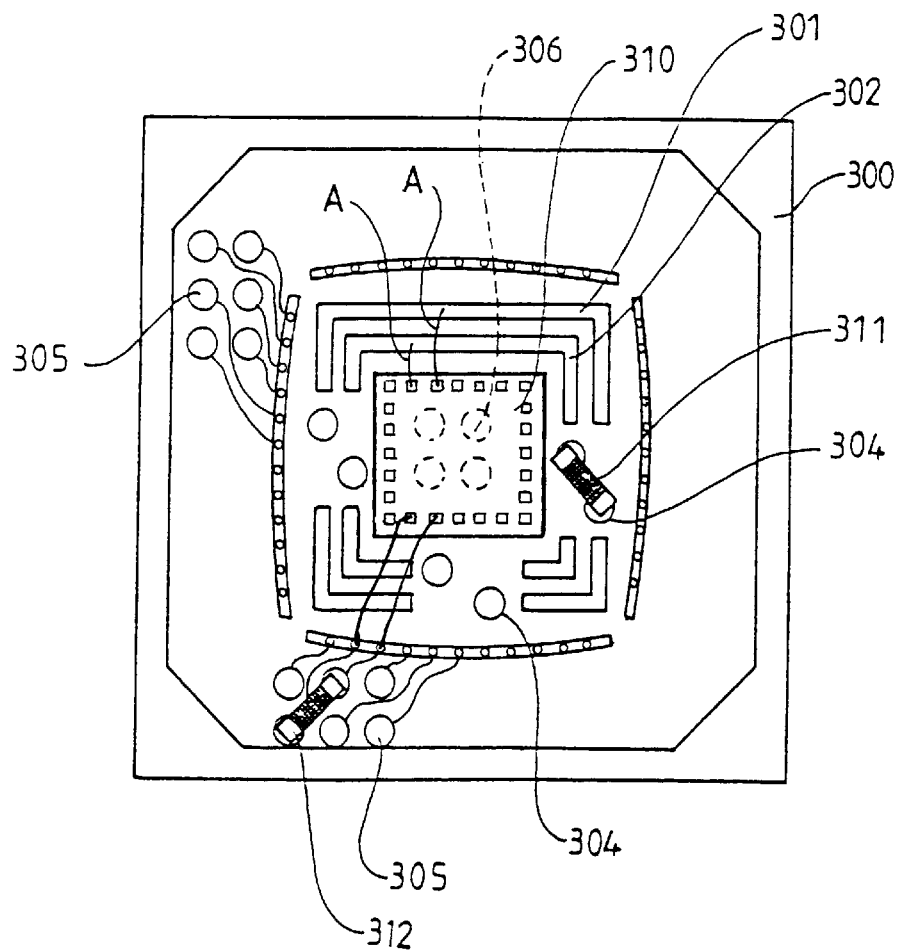
FIG. 6 is a top view of the circuit module of the substrate in accordance with the present invention.

Referring to FIGS. 5 and 6, a plurality of wires A are bonded to the chip to form the closed loop on the substrate 300. The pads for power and grounding of the chip are connected to the power ring 301 and the ground ring 302 by wire A. After the solder mask covers the substrate 300, a plurality of first electronic parts 311 and a plurality of second electronic parts 312 are attached to the substrate 300 by surface mount technology according to need. The first electronic part 311 is diagonally connected to the power ring 301 and the ground ring 302 near the chip area 310 so as to satisfy the requirement of the electronic part being close to the chip. The second electronic part 312 is diagonally connected to the holes 305 which are electrically connected to power and ground. Thus the electronic part of the present invention does not necessitate arranging other holes and traces and can still be arranged on the substrate 300. According to the requirement for keeping the electronic part close to the chip, it can only choose the first electronic part 311 or the second electronic part 312.

Figure 1:
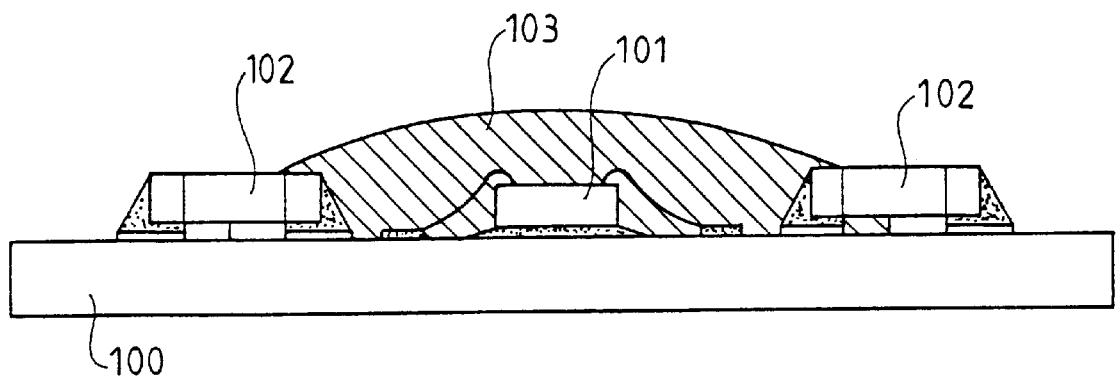
FIG. 1 is a side view of the circuit module in accordance with U.S. Pat. No. 5,906,700.
Figure 2:
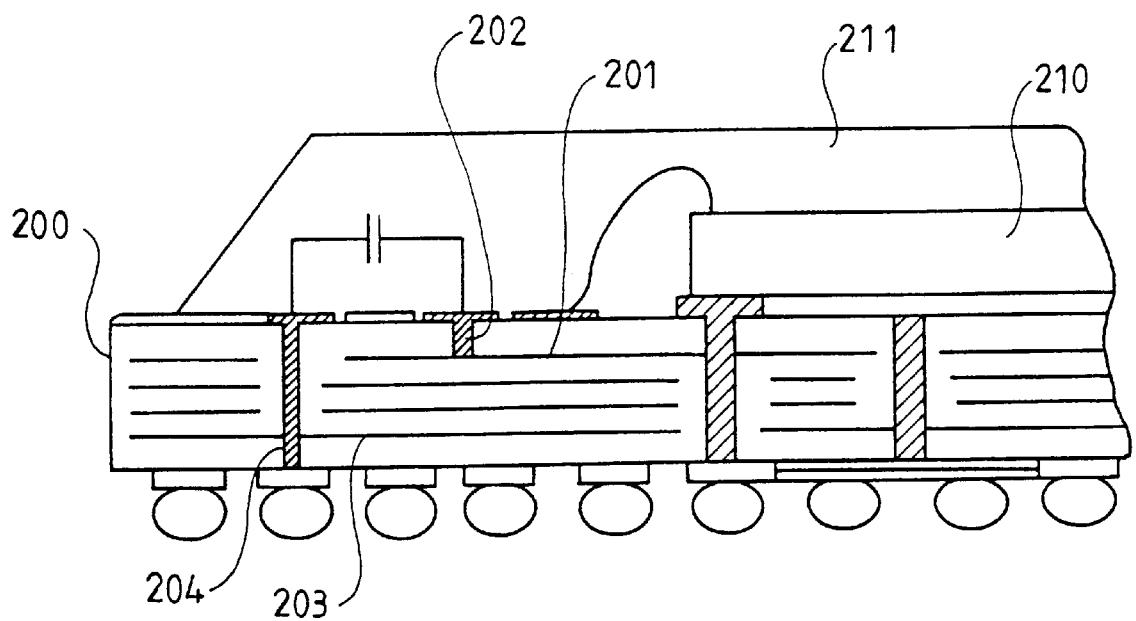
FIG. 2 is a side view of the electronic package in accordance with U.S. Pat. No. 5,825,628.

The substrate 300 of the present invention mainly maintains the arrangement of the power ring 301, the ground ring 302 and the holes 303 on which are further provided the openings 304 and 305 of the solder mask for connection to the electronic parts 311 and 312. The present invention can therefore sufficiently use the dimensions of the surface of the substrate 300. However, U.S. Pat. No. 5,906,700 needs to rearrange the pattern of the substrate 100 to be able to receive the electronic part, as shown in FIG. 1. U.S. Pat. No. 5,825,628 can only be applied to the multi-layer PCB of the substrate 200 with holes which connect to the power layer 203 and the ground layer 205 located in the substrate 200. Because the substrate of U.S. Pat. No. 5,825,628 needs to arrange the holes and the traces connecting to the power layer and the ground layer, the substrate fails to meet the need of keeping the electronic part close to the chip.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A circuit module of a BGA substrate comprising:
   a substrate including a power ring, a ground ring and a plurality of holes, the power ring and the ground ring are arranged between a chip area and a wire bonding area and provide for a power pad and a ground pad for chip wire bonding;
   a solder mask having a plurality of openings corresponding to the power ring and the ground ring such that when the solder mask covers the substrate part of the power ring and the ground ring are located in the openings; and
   an electronic part for attachment diagonally through the openings for connection to the power ring and the ground ring.

2. A circuit module of a BGA substrate as defined in claim 1, wherein the substrate is a dual-layer PCB.

3. A circuit module of a BGA substrate as defined in claim 1, wherein the electronic part is adhered to the openings by surface mount technology to electrically connect to the power ring and the ground ring.

4. A circuit module of a BGA substrate as defined in claim 1, wherein the openings are printed to form a pad therein.

5. A circuit module of BGA substrate comprising:
   a substrate including a plurality of holes which are electrically connected to a power ring and a ground ring by traces on a surface of the substrate;
   a solder mask having a plurality of openings corresponding to the holes such that, when the solder mask covers on the substrate, the power ring and the ground ring are electrically connected to the associated holes corresponding to the openings; and
   an electronic part which is attached diagonally to the openings for connection to the power ring and the ground ring.

6. A circuit module of a BGA substrate as defined in claim 5, wherein the substrate is a dual-layer PCB.

7. A circuit module of a BGA substrate as defined in claim 5, wherein the electronic part is adhered to the openings by surface mount technology to electrically connect to the power ring and the ground ring.

8. A circuit module of a BGA substrate as defined in claim 5, wherein the openings are printed to form a pad therein.

9. A structure for utilizing a solder mask for a circuit, wherein the structure comprises:
   a substrate having a power ring, a ground ring and a plurality of holes, wherein the power ring and the ground ring are arranged in between a chip area and a wire bonding area;
   a solder mask covers the substrate, wherein a plurality openings are formed over the solder mask, positions of the opening are corresponding to the power ring and the ground ring;
   an electronic part is electrically connected from the power ring and the ground ring to the openings in such a way that a location of the electronic part is close to the chip area;

a chip is electrical connected to the substrate by a plurality of wires.

10. A structure as defined in claim 9, wherein the substrate is a dual-layer PCB.

11. A structure as defined in claim 9, wherein the electronic part is diagonally connected to the openings on the substrate.

12. A structure as defined in claim 9, wherein the electronic part is adhered to the openings by surface mount technology to electrically connect to the power ring and the ground ring.

13. A structure as defined in claim 9, wherein the openings are printed to form a pad therein.

14. A structure for utilizing a solder mask for a circuit, wherein the structure comprises:

a substrate having a power ring, a ground ring and a plurality of holes, wherein the power ring and the ground ring are arranged in between a chip area and a wire bonding area, and a plurality of traces, which are formed on the substrate are electrically connected the power ring and the ground ring, a solder mask covers the substrate, wherein a plurality openings are formed over the solder mask, positions of the opening are corresponding to the power ring and the ground ring, and an electronic part is electrical diagonally connected from the power ring and the ground ring to the openings, wherein a location of the electronic part is close to the chip area; and a chip has a plurality of pads, which are electrical connected to the power ring and the ground ring of the substrate by a plurality of wires.

15. A structure as defined in claim 14, wherein the substrate is a dual-layer PCB.

16. A structure as defined in claim 14, wherein the electronic part is diagonally connected to the openings on the substrate.

17. A structure as defined in claim 14, wherein the electronic part is adhered to the openings by surface mount technology to electrically connect to the power ring and the ground ring.

18. A structure as defined in claim 14, wherein the openings are printed to form a pad therein.

* * * * *